(12) United States Patent
Lin et al.

(10) Patent No.: US 6,498,377 B1
(45) Date of Patent: Dec. 24, 2002

(54) SONOS COMPONENT HAVING HIGH DIELECTRIC PROPERTY

(75) Inventors: Hung-Sui Lin, Tainan (TW); Nian Kai Zous, Tau-Yuan (TW); Han Chao Lai, Taichung (TW); Tao Cheng Lu, Kaoshiung (TW)

(73) Assignee: Macronix International, Co., Ltd. (TW)

( * ) Notice: Subject to any disclaimer, the term of this patent is extended or adjusted under 35 U.S.C. 154(b) by 0 days.

(21) Appl. No.: 10/101,922

(22) Filed: Mar. 21, 2002

(51) Int. Cl.[7] .................. H01L 29/792; H01L 29/78
(52) U.S. Cl. .................. 257/411; 257/324; 257/410
(58) Field of Search ............................. 257/324, 410, 257/411

(56) References Cited

U.S. PATENT DOCUMENTS

| | | | |
|---|---|---|---|
| 5,473,179 A | * 12/1995 | Hong | 257/321 |
| 5,966,603 A | 10/1999 | Eitan | 438/258 |
| 6,011,725 A | 1/2000 | Eitan | 365/185.33 |
| 6,166,958 A | * 12/2000 | Naruke et al. | 257/324 |
| 6,291,297 B1 | * 9/2001 | Chen | 438/265 |

* cited by examiner

*Primary Examiner*—Allan R. Wilson
(74) *Attorney, Agent, or Firm*—Finnegan, Henderson, Farabow, Garrett & Dunner, L.L.P.

(57) ABSTRACT

A nitride read only memory device that includes a substrate having a source region, a drain region, and a channel region formed therebetween, a first oxide layer formed over the channel region, a nitride layer formed over the first oxide layer, a second oxide layer formed over the nitride layer, a gate structure formed over the second oxide layer, wherein a region in the substrate underneath the gate structure excludes one of the source and drain regions, a plurality of sidewall spacers formed over the nitride layer and contiguous with the gate structure, and at least one injection point for injecting electrons into the nitride layer, wherein the injection point is located at a junction between the channel region and one of the source and drain regions, and wherein electron charges are stored in portions of the nitride layer underneath the sidewall spacers.

18 Claims, 1 Drawing Sheet

SONOS COMPONENT HAVING HIGH DIELECTRIC PROPERTY

DESCRIPTION OF THE INVENTION

1. Field of the Invention

This invention relates in general to a silicon-oxide-nitride-oxide-silicon (SONOS) semiconductor component and, more particularly, to a SONOS component in a nitride read only memory (NROM) semiconductor device.

2. Background of the Invention

FIG. 1 is a prior art nitride read only memory (NROM) device 10. Referring to FIG. 1, the NROM device 10 includes a substrate 12 having an n-type source region 14, an n-type drain region 16, and a p-type channel region 18 formed therebetween. The NROM device 10 also includes an oxide-nitride-oxide (ONO) structure 28 formed over the channel region 18 and portions of the source 14 and drain 16 regions. The ONO structure 28 includes a first oxide layer 20 formed over the substrate 12, a nitride layer 22 formed over the first oxide layer 20, and a second oxide layer 24 formed over the nitride layer 22. The NROM device 10 further includes a gate structure 26 formed over the second oxide layer 24, and sidewall spacers (not shown) contiguous with at least the gate structure 26.

The nitride layer 22 "stores" electrical charges by trapping electrons therein, and the thickness of the first and second oxide layers 20, 24 should be sufficient to prevent leakage, i.e., direct tunneling of stored electrons under normal operating conditions. Erasing is accomplished using tunnel-enhanced hot hole injection, and programming is performed by channel hot electron injection. The NROM device 10 may store up to two physically separated bits, but only one bit may be programmed and stored at a time. U.S. Pat. No. 6,011,725, entitled "Two Bit Non-Volatile Electrically Erasable and Programmable Semiconductor Memory Cell Utilizing Asymmetrical Charge Trapping," by Boaz Eitan describes a non-volatile memory device based on an NROM cell for storing two bits of data, and is hereby incorporated by reference.

Because the nitride layer 22 is capable of storing charges independently, two bits of data may be written into the NROM device 10. Referring again to FIG. 1, electrons are injected, during programming, into the nitride layer 22 at one of the injection points A and B, and stored in one of portions 22-1 and 22-2, respectively, of the nitride layer 22. The injection point A is located at the junction between the source region 14 and channel region 18. The injection point B is located at the junction between the drain region 16 and channel region 18. Both the source region 14 and drain region 16 encroach the area of the substrate 12 directly beneath the gate structure 26 because of diffusion of the n-type impurities. As a result, both of the injection points A and B are located underneath the gate structure 26.

Because of the proximity between the portions 22-1 and 22-2, interference, or cross-talk, between the stored two bits of data may prevent the stored data from being accurately read out. Thus, the locations for storing the electron charges are generally separated by as much distance as possible.

SUMMARY OF THE INVENTION

In accordance with the invention, there is provided a semiconductor memory device that includes a substrate having a source region, a drain region, and a channel region formed therebetween, a first oxide layer formed over the channel region, a nitride layer formed over the first oxide layer, a second oxide layer formed over the nitride layer, a gate structure formed over the second oxide layer, wherein a region in the substrate underneath the gate structure excludes one of the source and drain regions, and at least one sidewall spacer formed over the nitride layer and contiguous with the gate structure, wherein the at least one sidewall spacer has a dielectric constant value sufficient to form an inversion region in a substrate region underneath the sidewall spacer to connect the region beneath the sidewall spacer with the channel, source and drain regions, and wherein electron charges are stored in portions of the nitride layer underneath the at least one sidewall spacer.

In one aspect, the semiconductor device further includes at least one injection point for injecting electrons into the nitride layer, wherein the injection point is located at a junction between the channel region and one of the source and drain regions.

In another aspect, the injection point is located underneath the sidewall spacer.

In yet another aspect, the dielectric constant value is between approximately 25 and 30.

Also in accordance with the present invention, there is provided a over the channel region, a nitride layer formed over the first oxide layer, a second oxide layer formed over the nitride layer, a gate structure formed over the second oxide layer, wherein a region in the substrate underneath the gate structure excludes one of the source and drain regions, a plurality of sidewall spacers formed over the nitride layer and contiguous with the gate structure, and at least one injection point for injecting electrons into the nitride layer, wherein the injection point is located at a junction between the channel region and one of the source and drain regions, and wherein electron charges are stored in portions of the nitride layer underneath the sidewall spacers.

In one aspect, the injection point is located underneath one of the sidewall spacers.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the present embodiment of the invention, an example of which is illustrated in the accompanying drawings. Wherever possible, the same reference numbers will be used throughout the drawings to refer to the same or like parts.

Figure 1:
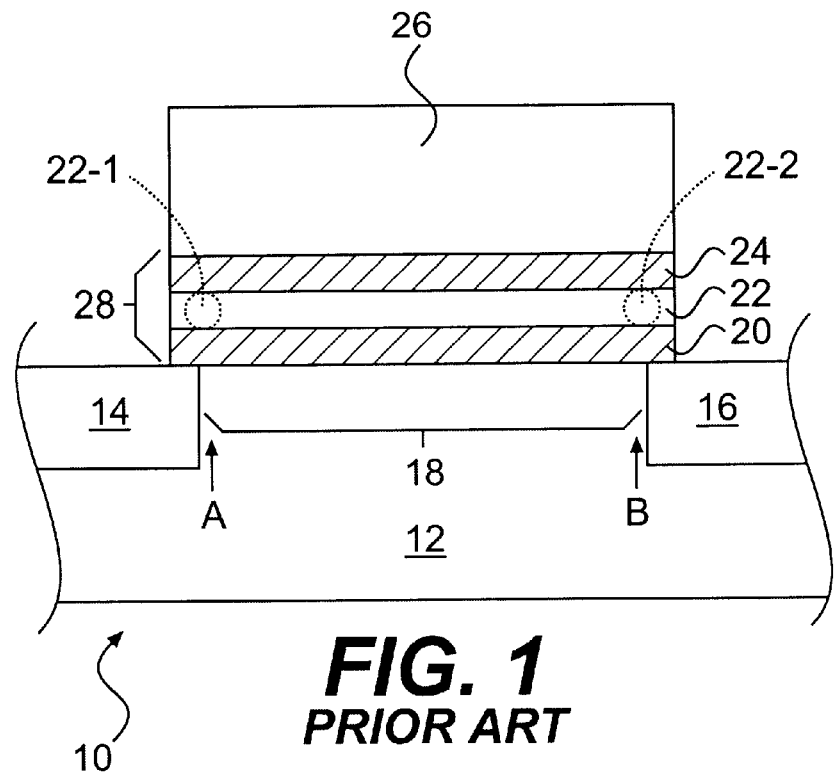
FIG. 1 is a prior art NROM device.
Figure 2:
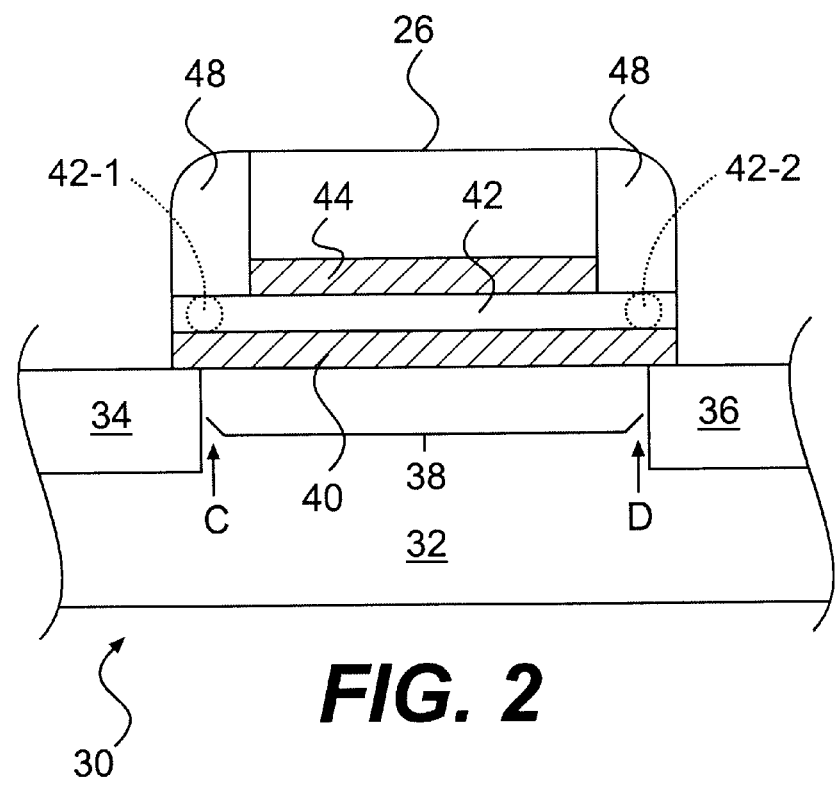
FIG. 2 is a cross-sectional view of an NROM device consistent with one embodiment of the invention.

FIG. 2 is a cross-sectional view of an NROM device 30 consistent with one embodiment of the invention. Referring to FIG. 2, the NROM device 30 includes a silicon substrate 32 having a source region 34, a drain region 36, and a channel region 38 formed therebetween. The NROM device 30 may be either an n-type NROM or a p-type NROM. In one embodiment, the source region 34 and drain region 36 are n-type regions and the channel region 38 is a p-type region. In another embodiment, the source region 34 and drain region 36 are p-type regions and the channel region 38 is an n-type region.

The NROM device 30 also includes an oxide-nitride-oxide (ONO) structure (not numbered) comprising a first oxide layer 40 formed over the channel region 38, a nitride layer 42 formed over the first oxide layer 40, and a second oxide layer 44 formed over the nitride layer 42. The NROM device 30 further includes a polysilicon gate structure 46 formed over the second oxide layer 44, and sidewall spacers 48 formed over the nitride layer 42 and contiguous with the gate structure 46. The sidewall spacers 48 have a high dielectric constant K and may comprise oxide materials such as $Ta_2O_5$.

In operation, the NROM device 30 of the present invention is capable of storing up to two bits of data. Referring again to FIG. 2, electrons are injected, during programming, into the nitride layer 42 at one of the injection points C and D, and stored in one of the edges 42-1 and 42-2, respectively, of the nitride layer 42. The injection point C is located at the junction between the source region 34 and channel region 38. The injection point D is located at the junction between the drain region 36 and channel region 38. Both injection points C and D are located in areas of the substrate 32 directly underneath the sidewall spacers 48, and outside the region directly underneath the gate structure 46.

During the manufacturing process of the present invention, the formation of the source region 34 and drain region 36 is controlled so that neither region diffuses into the region of the substrate 32 directly underneath the gate structure 46. The sidewall spacers 48, having a high dielectric constant, enable the formation of a low-impedance inversion region underneath the sidewall spacers 48, in effect connecting the regions beneath the sidewall spacers 48 with the channel region 38, the source region 34, and the drain region 36. The low-impedance inversion region also allows larger current flow through the substrate regions underneath the sidewall spacers 48. Therefore, the higher the dielectric constant, e.g., greater than 25, a larger inversion region with a lower impedance may be formed. In one embodiment, the sidewall spacers 48 have a dielectric constant value between approximately 25 to 30. The channel region 38 of the present invention is extended beyond the region directly underneath the gate structure 46. During programming, the junction between the inversion region and one of the source region 34 and drain region 36 forms an electron injection point because the junction possesses the highest electrical field in the substrate 32 of the NROM device 30.

Therefore, the present invention is able to control the locations of the electron injection points through the use of sidewall spacers with certain characteristics. The electron injection points of the present invention are moved outside the conventional channel region to eliminate interference between the two stored bits of data in the ONO structure. The channel region of the present invention is extended through the inversion regions generated by the sidewall spacers 48 that possess a high dielectric constant K. Because the interference, or cross-talk, between the two stored bits of data are eliminated with the present invention, the gate length of the NROM device of the present invention may be reduced for future sub-micron applications.

Other embodiments of the invention will be apparent to those skilled in the art from consideration of the specification and practice of the invention disclosed herein. It is intended that the specification and examples be considered as exemplary only, with a true scope and spirit of the invention being indicated by the

What is claimed is:

1. A semiconductor memory device, comprising:
   a substrate having a source region, a drain region, and a channel region formed therebetween;
   a first oxide layer formed over the channel region;
   a nitride layer formed over the first oxide layer;
   a second oxide layer formed over the nitride layer;
   a gate structure formed over the second oxide layer, wherein a region in the substrate underneath the gate structure excludes one of the source and drain regions; and
   at least one sidewall spacer formed over the nitride layer and contiguous with the gate structure,
   wherein the at least one sidewall spacer has a dielectric constant value sufficient to form an inversion region in a substrate region underneath the sidewall spacer to connect the region beneath the sidewall spacer with the channel, source and drain regions, and
   wherein electron charges are stored in portions of the nitride layer underneath the at least one sidewall spacer.

2. The semiconductor device as claimed in claim 1, further comprising at least one injection point for injecting electrons into the nitride layer, wherein the injection point is located at a junction between the channel region and one of the source and drain regions.

3. The semiconductor device as claimed in claim 2, wherein the injection point is located underneath the sidewall spacer.

4. The semiconductor device as claimed in claim 1, wherein the sidewall spacer comprises $Ta_2O_5$.

5. The semiconductor device as claimed in claim 1, wherein the dielectric constant value is greater than 25.

6. The semiconductor device as claimed in claim 1, wherein the dielectric constant value is between approximately 25 and 30.

7. The semiconductor device as claimed in claim 1, wherein the source and drain regions are n-type regions and the channel region is a p-type region.

8. The semiconductor device as claimed in claim 1, wherein the source and drain regions are p-type regions and the channel region is an n-type region.

9. The semiconductor device as claimed in claim 1, wherein the region in the substrate underneath the gate structure excludes both of the source and drain regions.

10. A nitride read only memory device, comprising:
    a substrate having a source region, a drain region, and a channel region formed therebetween;
    a first oxide layer formed over the channel region;
    a nitride layer formed over the first oxide layer;
    a second oxide layer formed over the nitride layer;
    a gate structure formed over the second oxide layer, wherein a region in the substrate underneath the gate structure excludes one of the source and drain regions;
    a plurality of sidewall spacers formed over the nitride layer and contiguous with the gate structure; and
    at least one injection point for injecting electrons into the nitride layer,
    wherein the injection point is located at a junction between the channel region and one of the source and drain regions, and wherein electron charges are stored in portions of the nitride layer underneath the sidewall spacers.

11. The memory device as claimed in claim 10, wherein the injection point is located underneath one of the sidewall spacers.

12. The memory device as claimed in claim 10, wherein the sidewall spacers have a dielectric constant value sufficient to form an inversion region in a substrate region underneath the sidewall spacer to connect the region beneath the sidewall spacer with the channel, source and drain regions.

13. The memory device as claimed in claim 10, wherein the sidewall spacer comprises $Ta_2O_5$.

14. The memory device as claimed in claim 10, wherein the dielectric constant value is greater than 25.

15. The memory device as claimed in claim 10, wherein the dielectric constant value is between approximately 25 and 30.

16. The memory device as claimed in claim 10, wherein the source and drain regions are n-type regions and the channel region is a p-type region.

17. The memory device as claimed in claim 10, wherein the source and drain regions are p-type regions and the channel region is an n-type region.

18. The memory device as claimed in claim 10, wherein the region in the substrate underneath the gate structure excludes both of the source and drain regions.

* * * * *